United States Patent
Kato et al.

(10) Patent No.: US 11,009,523 B2
(45) Date of Patent: May 18, 2021

(54) PROBE, INSPECTION JIG, AND INSPECTION APPARATUS

(71) Applicants: Nidec-Read Corporation, Kyoto (JP); Nidec SV Probe Pte. Ltd., Singapore (SG)

(72) Inventors: Minoru Kato, Kyoto (JP); Tadakazu Miyatake, Kyoto (JP); Akio Hayashi, Kyoto (JP); Masaki Naganuma, Kyoto (JP); Matthias Joseph Chin Chieh Chia, Singapore (SG); Cheng Ghee Ong, Singapore (SG); Raminderjit Singh, Singapore (SG)

(73) Assignees: Nidec-Read Corporation, Kyoto (JP); Nidec SV Probe Pte. Ltd., Singapore (SG)

( * ) Notice: Subject to any disclaimer, the term of this patent is extended or adjusted under 35 U.S.C. 154(b) by 179 days.

(21) Appl. No.: 16/504,323

(22) Filed: Jul. 7, 2019

(65) Prior Publication Data
US 2020/0018779 A1   Jan. 16, 2020

(30) Foreign Application Priority Data
Jul. 13, 2018   (JP) .............................. JP2018-133736

(51) Int. Cl.
*G01R 1/067* (2006.01)
*G01R 1/073* (2006.01)
*G01R 31/70* (2020.01)

(52) U.S. Cl.
CPC ..... *G01R 1/06733* (2013.01); *G01R 1/07342* (2013.01); *G01R 31/70* (2020.01)

(58) Field of Classification Search
CPC ................ G01R 1/06733; G01R 31/70; G01R 1/07342; G01R 1/07307; G01R 27/02
USPC .................................... 324/755.01, 537, 500
See application file for complete search history.

(56) References Cited

U.S. PATENT DOCUMENTS

| 7,952,373 B2 * | 5/2011 | Mok ........................ G01R 3/00 324/754.14 |
| 10,914,758 B2 * | 2/2021 | Yamazaki .......... G01R 1/07371 |
| 2009/0230975 A1 * | 9/2009 | Yamada ............... G01R 1/0735 324/537 |

FOREIGN PATENT DOCUMENTS

JP   2004184374   7/2004

* cited by examiner

*Primary Examiner* — Giovanni Astacio-Oquendo
(74) *Attorney, Agent, or Firm* — JCIPRNET

(57) ABSTRACT

A probe is a probe having a substantially bar-like shape and includes a distal end portion with a substantially columnar shape adapted to be in contact with an inspection point provided on a device under test, a base end portion with a substantially columnar shape on an opposite side of the distal end portion, and a main body portion formed in a flat ribbon shape and extended to connect the distal end portion to the base end portion. The distal end portion is provided with a distal end surface inclined relative to and intersecting with an axial center of the probe.

20 Claims, 13 Drawing Sheets

PROBE, INSPECTION JIG, AND INSPECTION APPARATUS

CROSS-REFERENCE TO RELATED APPLICATION

This application claims the priority benefits of Japan Patent Application No. 2018-133736, filed on Jul. 13, 2018. The entirety of the above-mentioned patent application is hereby incorporated by reference herein and made a part of this specification.

BACKGROUND

Field of the Invention

The present invention relates to a probe, an inspection jig, and an inspection apparatus for use in an inspection.

Description of Related Art

Conventionally, an interconnect pattern on a circuit board is required to have low resistance to transmit an electric signal to a semiconductor such as an IC and an electric component mounted on the circuit board and give an electric signal to a liquid crystal or plasma panel, and a resistance value of the interconnect pattern formed on the board is measured to inspect whether the interconnect pattern is good or defective. To measure the resistance value of the interconnect pattern, a probe is brought into contact with each of two inspection points provided on the interconnect pattern serving as a device under test, measuring current having a predetermined level is supplied between the probes, and voltage generated between the probes is measured. The resistance value of the interconnect pattern is then measured with use of Ohm's law.

However, as in the above case, in a case in which the probe brought into contact with each of the two inspection points on the interconnect pattern is used both for supply of measuring current and for measurement of voltage, this causes a problem in which contact resistance between the probe and the inspection point influences voltage to be measured to cause measurement accuracy of the resistance value to be lowered. To solve the problem, a probe for current supply and a probe for voltage measurement are brought into contact with each inspection point. Subsequently, measuring current is supplied between the probes for current supply, as a pair, contacting the respective inspection points, and voltage generated between the probes for voltage measurement, as a pair, contacting the respective inspection points is measured. Such a measurement method of measuring a resistance value with high accuracy by suppressing the influence of the contact resistance between each of the probes and each of the inspection points is known as a four-point probe method (for example, refer to Japanese Patent Laid-Open No. 2004-184374).

PATENT DOCUMENTS

[Patent Document 1] Japanese Patent Laid-Open No. 2004-184374

SUMMARY OF THE INVENTION

As described above, in a case in which an interconnect pattern is inspected by means of the four-point probe method, two probes including a probe for current supply and a probe for voltage measurement are required to contact each inspection point. On the other hand, in recent years, scaling-down of a circuit board has progressed, and a pad, an electrode, or the like serving as an inspection point has been downsized. Consequently, it is difficult to bring two probes into contact with one inspection point.

The present invention provides a probe, an inspection jig including the probe, and an inspection apparatus enabling two probes to easily contact a fine inspection point.

A probe according to the present invention is a probe having a substantially bar-like shape and includes a distal end portion with a substantially columnar shape adapted to be in contact with an inspection point provided on a device under test, a base end portion on an opposite side of the distal end portion, and a main body portion formed in a flat ribbon shape and extended to connect the distal end portion to the base end portion. The distal end portion is provided with a distal end surface inclined relative to and intersecting with an axial center of the probe.

According to this configuration, since the distal end portion of the probe is provided with the distal end surface inclined relative to and intersecting with the axial center of the probe, an apex portion of the distal end portion or an apex portion of the probe is located at a position deviating from the axial center. Thus, in a case in which the two probes are arranged in a direction in which the probes are adjacent to each other such that the apex portions may be closest to each other to be brought into contact with the inspection point, the distance between the apex portions can be shorter than the distance between the axial centers of the two probes. As a result, two probes can easily be brought into contact with a fine inspection point. Also, the distal end portion and the base end portion are connected by the main body portion formed in the flat ribbon shape. Thus, when the probe is bent, the probe is bent in a thickness direction of the ribbon shape. The bending direction of the probe then defines a rotation angle of the probe. As a result, the probes as a pair can easily be arranged in a direction in which the probes are adjacent to each other such that the apex portions may be closest to each other.

Also, on both edge portions on lateral sides of the distal end surface, chamfered surfaces that communicate with a circumferential surface of the distal end portion and that are tapered are preferably formed.

In a case in which the distal end surface inclined relative to and intersecting with the axial center of the probe is in a shape obtained by cutting the substantially columnar distal end portion in a flat shape, an angle between both edge portions on the distal end side on the right and left sides of the axial center of the distal end surface and the circumferential surface of the distal end portion is an acute angle. For this reason, the thicknesses of the both edge portions on the distal end side on the lateral sides of the distal end surface are thin. As a result, the portions may be scraped off due to lowering of the strength, the scraped parts may be particles, and the particles may contaminate the device under test. Under such circumstances, according to the present configuration, both the edge portions on the lateral sides of the distal end surface are so-called chamfered, and the chamfered surfaces that communicate with the circumferential surface of the distal end portion and that are tapered are formed. Accordingly, a possibility that the edge portions of the distal end surface are scraped off, that the scraped parts become particles, and the particles contaminate the device under test is reduced.

Also, a width direction of the distal end surface and a width direction of the main body portion formed in the ribbon shape are preferably in a substantially equal direction.

According to this configuration, in a case in which the probe is held in a bent state, the probe is bent in a thickness direction of the ribbon shape. Thus, the direction of the probe (rotation angle) can be defined. Since the width direction of the distal end surface and the width direction of the ribbon shape are in the substantially equal direction, the distal end surface faces in the bent direction. As a result, the two probes can easily be arranged in a direction in which the probes are adjacent to each other such that the apex portions may be closest to each other.

Also, a width direction of the distal end surface and a width direction of the main body portion formed in the ribbon shape are preferably substantially perpendicular to each other.

According to this configuration, in a case in which the probe is held in a bent state, the probe is bent in a thickness direction of the ribbon shape. Thus, the direction of the probe (rotation angle) can be defined. Since the width direction of the distal end surface and the width direction of the ribbon shape are substantially perpendicular, the distal end surface faces in a direction perpendicular to the bent direction. As a result, the two probes can easily be arranged in a direction in which the probes are adjacent to each other such that the apex portions may be closest to each other.

Also, the main body portion is preferably curved to protrude in a direction substantially perpendicular to a wide width surface formed in the ribbon shape.

According to this configuration, since the probes are curved in advance, at the time of assembling work of attaching the probes to the support member, the distal end surfaces of the probes can be easily assembled in the correct direction in which the probes are adjacent to each other such that the apex portions Pp may be closest to each other.

Also, an inspection jig according to the present invention includes a plurality of probes each of which is the aforementioned probe, and a holding member adapted to hold the plurality of probes in a direction substantially perpendicular to the wide width surface formed in the ribbon shape with two adjacent probes in the plurality of probes as a pair and in a direction in which the probes as the pair are adjacent to each other such that apex portions of the distal end surfaces may be closest to each other in a state in which the probes as the pair are bent in equal directions.

According to this configuration, since the probes as a pair are arranged and held by the holding member in a direction in which the probes are adjacent to each other such that the apex portions may be closest to each other, the distance between the apex portions can be shorter than the distance between the axial centers of the probes. As a result, two probes can easily be brought into contact with a fine inspection point.

Also, in the base end portion, a dimension in a width direction perpendicular to the axial center is preferably larger than a dimension in a thickness direction perpendicular to the width direction. The holding member preferably includes a restriction plate provided with restriction holes into which the base end portions of the plurality of probes are respectively inserted. In each of the restriction holes, a length in a first direction perpendicular to a depth direction is preferably longer than the dimension in the width direction of the base end portion, and a length in a second direction perpendicular to the first direction is preferably shorter than the dimension in the width direction of the base end portion.

According to this configuration, since the base end portions are fitted into the restriction holes, and rotation of the probes is thus prevented, the probes as a pair are easily arranged and held in a direction in which the probes are adjacent to each other such that the apex portions may be closest to each other.

Also, an inspection jig according to the present invention includes a plurality of probes each having a substantially bar-like shape and including a distal end portion with a substantially columnar shape adapted to be in contact with an inspection point provided on a device under test, a base end portion on an opposite side of the distal end portion, and a main body portion extended to connect the distal end portion to the base end portion, the distal end portion being provided with a distal end surface inclined relative to and intersecting with an axial center with the bar-like shape, and in the base end portion, a dimension in a width direction perpendicular to the axial center being larger than a dimension in a thickness direction perpendicular to the width direction, and a holding member adapted to hold the plurality of probes with two adjacent probes in the plurality of probes as a pair and in a direction in which the probes as the pair are adjacent to each other such that apex portions of the distal end surfaces may be closest to each other. The holding member includes a restriction plate provided with restriction holes into which the base end portions of the plurality of probes are respectively inserted. In each of the restriction holes, a length in a first direction perpendicular to a depth direction is longer than the dimension in the width direction of the base end portion, and a length in a second direction perpendicular to the first direction is shorter than the dimension in the width direction of the base end portion.

According to this configuration, since the probes as a pair are arranged and held by the holding member in a direction in which the probes are adjacent to each other such that the apex portions may be closest to each other, the distance between the apex portions can be shorter than the distance between the axial centers of the probes. As a result, two probes can easily be brought into contact with a fine inspection point. Further, since the base end portions are fitted into the restriction holes, and rotation of the probes is thus prevented, the probes as a pair are easily kept in a direction in which the probes are adjacent to each other such that the apex portions may be closest to each other.

Also, a width direction of the distal end surface and the width direction of the base end portion are preferably in a substantially equal direction.

According to this configuration, when the probes as a pair are arranged in a direction in which the probes are adjacent to each other such that the apex portions may be closest to each other, the width directions of the base end portions in the probes as a pair are parallel to each other. As a result, since the distance between the base end portions in the probes as a pair is broadened, the distance between the probes as a pair can easily be shortened.

Also, in each of the restriction holes, the length in the second direction is preferably longer than a maximum width of the main body portion.

According to this configuration, the distal end portion of the probe can be inserted in the restriction hole, the main body portion can pass through the restriction hole, the probe can further be inserted, and the base end portion can be located inside the restriction hole. Thus, the inspection jig can be assembled easily.

Also, the restriction plate preferably includes a rear surface from which a distal end of the base end portion protrudes, and each of the restriction holes is preferably arranged at a position away from the rear surface by a predetermined distance.

According to this configuration, the restriction hole is located at a position away from the rear surface of the restriction plate by a predetermined distance, that is, at a position of the base end portion further away from the distal end of the base end portion. As a result, compared with a case in which rotation of the probe is restricted at a position almost around the distal end of the base end portion, a possibility that the base end portion drops out of the restriction hole and that the probe is rotated is reduced.

Also, an inspection apparatus according to the present invention includes the aforementioned inspection jig and an inspection processing unit configured to inspect the device under test on a basis of an electric signal obtained by bringing the probe into contact with the inspection point.

According to this configuration, since two probes can easily contact a fine inspection point, an inspection by means of the four-point probe method can be performed easily.

The probe, the inspection jig, and the inspection apparatus configured as above enable two probes to easily contact a fine inspection point.

DETAILED DESCRIPTION OF PREFERRED EMBODIMENTS

Figure 1:
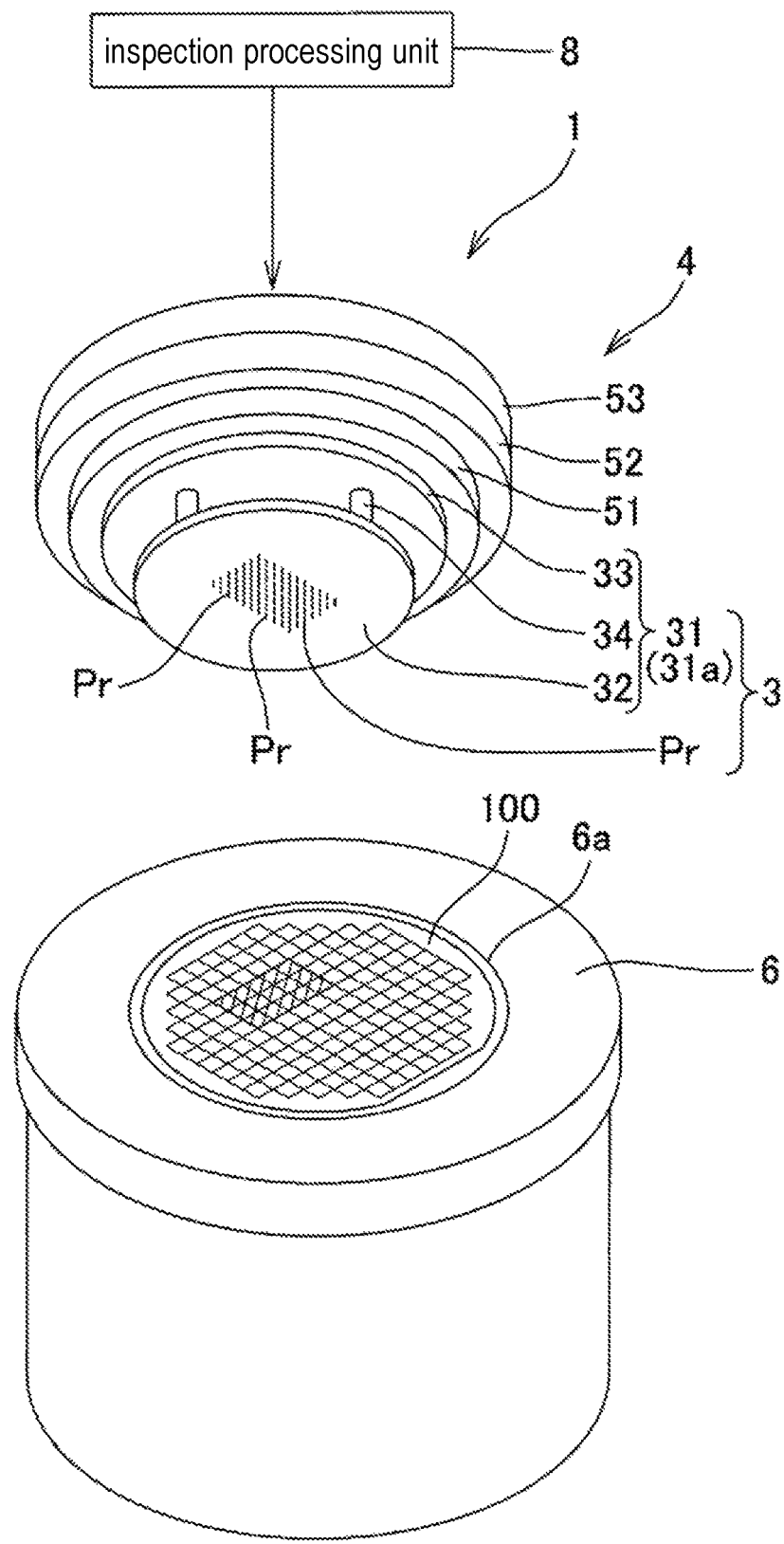
FIG. 1 is a conceptual diagram schematically illustrating a configuration of an inspection apparatus provided with an inspection jig according to an embodiment of the present invention.

Hereinbelow, embodiments of the present invention will be described with reference to the accompanying drawings. Note that components with the same reference numerals in the respective drawings will be the same components and description thereof will be omitted.

First Embodiment

FIG. 1 is a conceptual diagram schematically illustrating a configuration of an inspection apparatus 1 provided with an inspection jig according to an embodiment of the present invention. The inspection apparatus 1 corresponds to an example of an inspection apparatus. The inspection apparatus 1 illustrated in FIG. 1 is an inspection apparatus for inspecting a circuit formed on a device under test 100.

The device under test 100 is a semiconductor wafer, for example. In the device under test 100, circuits corresponding to a plurality of semiconductor chips are formed on a semiconductor board made of silicon or the like. Note that the device under test may be an electronic component such as a semiconductor chip, a chip size package (CSP), and a semiconductor element (integrated circuit (IC)) or another device subject to an electric inspection.

The inspection apparatus 1 illustrated in FIG. 1 includes an inspection unit 4, a sample platform 6, and an inspection processing unit 8. A placement portion 6a on which the device under test 100 is placed is provided on an upper surface of the sample platform 6, and the sample platform 6 is configured to secure the device under test 100 that is an inspection target at a predetermined position.

The placement portion 6a is adapted to be able to be lifted and lowered and is adapted to enable the device under test 100 accommodated in the sample platform 6 to be lifted to an inspection position and enable the device under test 100 after the inspection to be stored in the sample platform 6, for example. Also, the placement portion 6a is adapted to enable the device under test 100 to rotate and orient an orientation flat to a predetermined direction, for example. Also, the inspection apparatus 1 includes a transport mechanism such as a robot arm, which is not illustrated in the drawing. By the transport mechanism, the device under test 100 is placed on the placement portion 6a, and the inspected device under test 100 is transported from the placement portion 6a.

The inspection unit 4 includes an inspection jig 3, a first pitch conversion block 51, a second pitch conversion block 52, and a connection plate 53. The inspection jig 3 is a jig for performing an inspection by causing a plurality of probes Pr to contact the device under test 100, and for example, the inspection jig 3 is configured as a so-called probe card.

A plurality of chips are formed in the device under test 100. A plurality of inspection points such as pads and bumps are formed in each of the chips. Corresponding to a partial region of the plurality of chips formed in the device under test 100 (for example, the hatched region in FIG. 1; hereinbelow, referred to as an inspection region), the inspection jig 3 holds the plurality of probes Pr such that the probes Pr correspond to the respective inspection points in the inspection region.

When the probes Pr have been brought into contact with the respective inspection points in the inspection region, and the inspection in the inspection region is finished, the placement portion 6a lowers the device under test 100, the sample platform 6 moves in parallel and causes the inspection region to move, the placement portion 6a causes the device under test 100 to be lifted, and an inspection is then performed by bringing the probes Pr into contact with a new inspection region. In this manner, the entire device under test 100 is inspected by performing the inspection while causing the inspection region to sequentially move.

Meanwhile, FIG. 1 is an explanatory diagram schematically and conceptually illustrating an example of the configuration of the inspection apparatus 1 from the viewpoint of allowing easy understanding of the present invention, and the number, the density, and the arrangement of the probes Pr, the shapes of and the size ratios between the respective portions of the inspection unit 4 and the sample platform 6, and the like are also illustrated in a simple and conceptual manner. For example, the inspection region is illustrated in an enlarged and emphasized manner as compared with a typical semiconductor inspection apparatus in terms of easy understanding of the arrangement of the probes Pr, and the inspection region may be smaller or larger.

The connection plate 53 is configured to enable the second pitch conversion block 52 to be detached therefrom and attached thereto. A plurality of not-illustrated electrodes to be connected to the second pitch conversion block 52 are formed on the connection plate 53. The respective electrodes of the connection plate 53 are electrically connected to the inspection processing unit 8 with not-illustrated cables, connection terminals, or the like. The first pitch conversion block 51 and the second pitch conversion block 52 are pitch conversion members for converting a pitch between the probes Pr into an electrode pitch on the connection plate 53.

The inspection jig 3 includes the plurality of probes Pr each including a distal end portion Pa and a base end portion Pb, which will be described below, and a support member 31 holding the plurality of probes Pr such that the distal end portions Pa or the base end portions Pb thereof are oriented toward the device under test 100.

An electrode 511, which is brought into contact with and electrically conductive to the base end portion Pb or the distal end portion Pa of each probe Pr, is provided at the first pitch conversion block 51 and will be described below. The inspection unit 4 includes a not-illustrated connection circuit that electrically connects the respective probes Pr of the inspection jig 3 to the inspection processing unit 8 via the connection plate 53, the second pitch conversion block 52 and the first pitch conversion block 51 and switches the connection.

In this manner, the inspection processing unit 8 is adapted to be able to supply an inspection signal to an arbitrary probe Pr and detects a signal from an arbitrary probe Pr via the connection plate 53, the second pitch conversion block 52 and the first pitch conversion block 51. Details of the first pitch conversion block 51 and the second pitch conversion block 52 will be described below.

Also, the inspection apparatus is not limited to a semiconductor inspection apparatus and may be a board inspection apparatus that inspects a board, for example.

Figure 2:
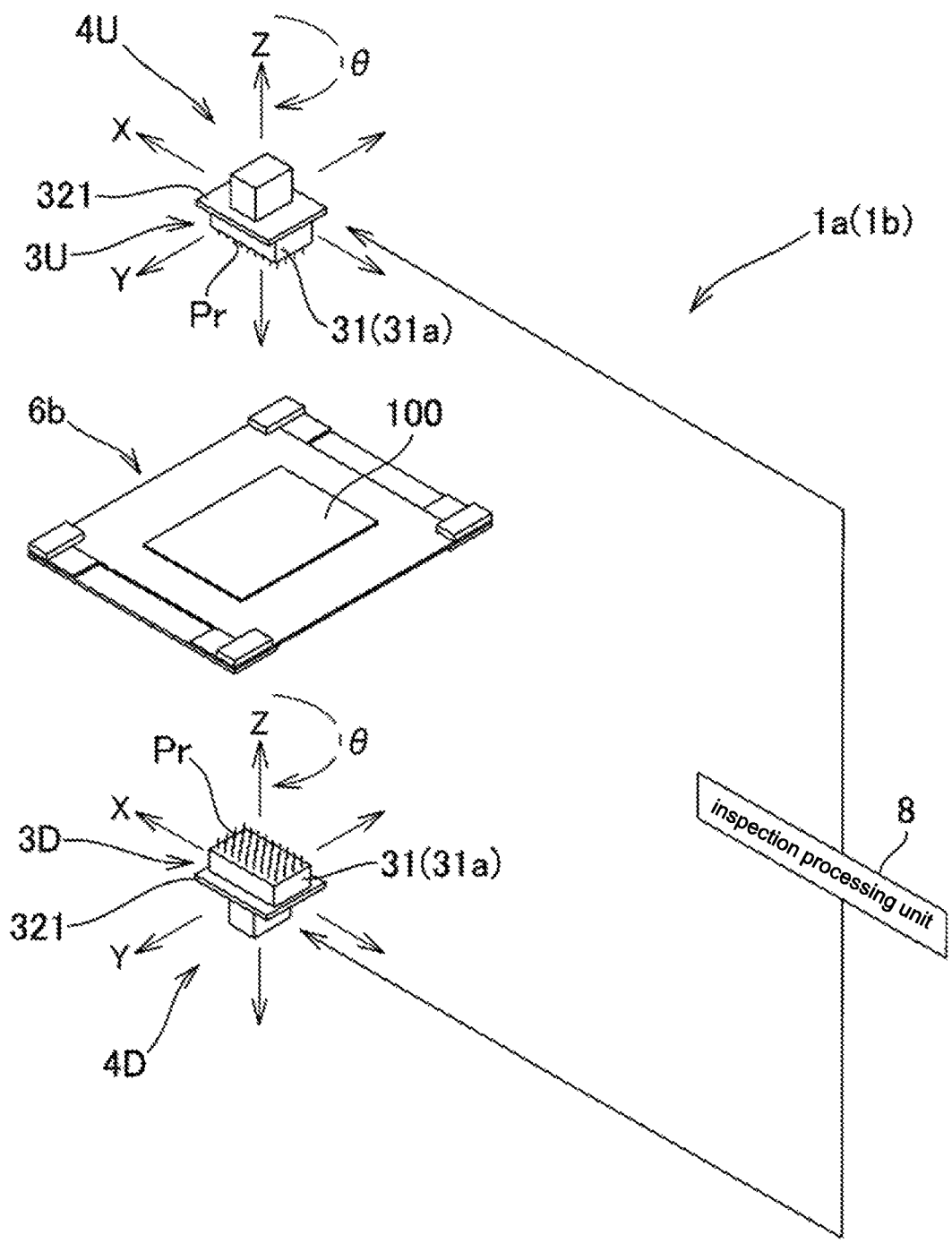
FIG. 2 is a conceptual diagram schematically illustrating another example of the inspection apparatus provided with the inspection jig according to the embodiment of the present invention.

FIG. 2 is a conceptual diagram schematically illustrating a configuration of an inspection apparatus 1a provided with an inspection jig according to an embodiment of the present invention. The inspection apparatus 1a illustrated in FIG. 2 is a board inspection apparatus used to inspect a circuit pattern formed on a board, which is an example of the device under test 100.

The device under test 100 may be, for example, a board such as a printed wiring board, a glass epoxy board, a flexible board, a ceramic multilayered interconnect board, a package board for a semiconductor package, an interposer board, and a film carrier, an electrode panel for a display such as a liquid crystal display, an electro-luminescence (EL) display, and a touch panel display, an electrode panel for a touch panel, a semiconductor board such as a semiconductor wafer, a semiconductor chip, and a chip size package (CSP), or boards of various kinds. The device under test may not necessarily be a board, but may alternatively be, for example, an electronic component such as a semiconductor device (e.g., an integrated circuit (IC)), or any other device subject to an electric inspection.

The inspection apparatus 1a illustrated in FIG. 2 includes inspection units 4U and 4D, a board securing device 6b, and an inspection processing unit 8. The board securing device 6b is configured to secure the device under test 100 to be inspected at a predetermined position. The inspection units 4U and 4D include inspection jigs 3U and 3D, respectively. Respectively, in the inspection units 4U and 4D, a not-illustrated driving mechanism enables the inspection jigs 3U and 3D to move in directions of X, Y, and Z axes perpendicular to each other and to rotate about the Z axis.

The inspection unit 4U is arranged above the device under test 100 secured on the board securing device 6b. The inspection unit 4D is arranged below the device under test 100 secured on the board securing device 6b. The inspection units 4U and 4D are constructed such that the inspection jigs 3U and 3D, respectively, which are used to inspect the circuit patterns formed on the board 100, can detachably be attached thereto. Each of the inspection jigs 3U and 3D may be a so-called probe card for inspecting a semiconductor wafer or the like. Hereinbelow, the inspection units 4U and 4D will collectively be referred to as an inspection unit 4 as appropriate.

Each of the inspection jigs 3U and 3D includes the plurality of probes Pr each including the distal end portion Pa and the base end portion Pb, which will be described below, the support member 31 holding the plurality of probes Pr such that the distal end portions Pa thereof are oriented toward the device under test 100, and a base plate 321. The base plate 321 is provided with not-illustrated electrodes each brought into contact with, and electrical connection with, the base end portion Pb of each probe Pr. Each of the inspection units 4U and 4D includes a not-illustrated connection circuit that electrically connects the base end portions Pb of the respective probes Pr to the inspection processing unit 8 via the corresponding electrodes of the base plate 321 and switches the connection.

The probe Pr has a substantially bar-like shape as a whole. The support member 31 includes a plurality of through holes each of which is configured to support a separate one of the probes Pr. The respective through holes are arranged to correspond to the positions of the inspection points set on an interconnect pattern of the device under test 100 that is an inspection target. In this manner, the distal end portions Pa of the probes Pr are adapted to be in contact with the inspection points of the device under test 100. For example, the plurality of probes Pr are disposed at positions corresponding to points of intersection on a grid. The grid is oriented such that horizontal and vertical lines of the grid extend in the directions of the X axis and the Y axis perpendicular to each other. The inspection points are, for example, interconnect patterns, solider bumps, connection terminals, or the like.

The inspection jigs 3U and 3D are similar in structure except in the arrangement of the probes Pr and in that the inspection jigs 3U and 3D are attached in opposite directions, i.e., upwardly and downwardly, to the inspection units 4U and 4D, respectively. Hereinbelow, the inspection jigs 3U and 3D will collectively be referred to as an inspection jig 3 as appropriate. The inspection jig 3 is adapted to be replaceable in accordance with the device under test 100 that is an inspection target.

Figure 3:
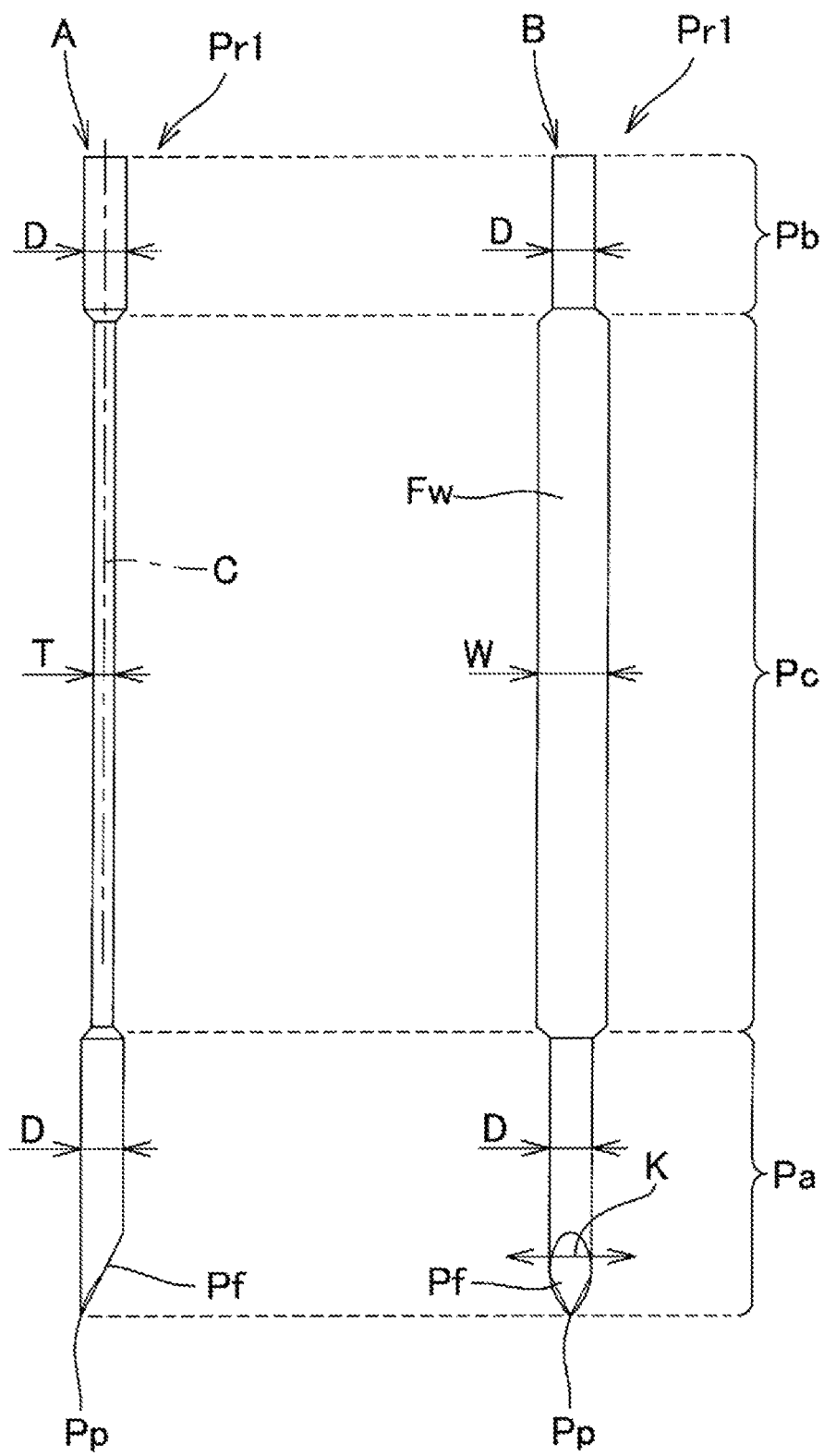
FIG. 3 is a front view and a side view of an example of a probe illustrated in FIGS. 1 and 2.
Figure 4:
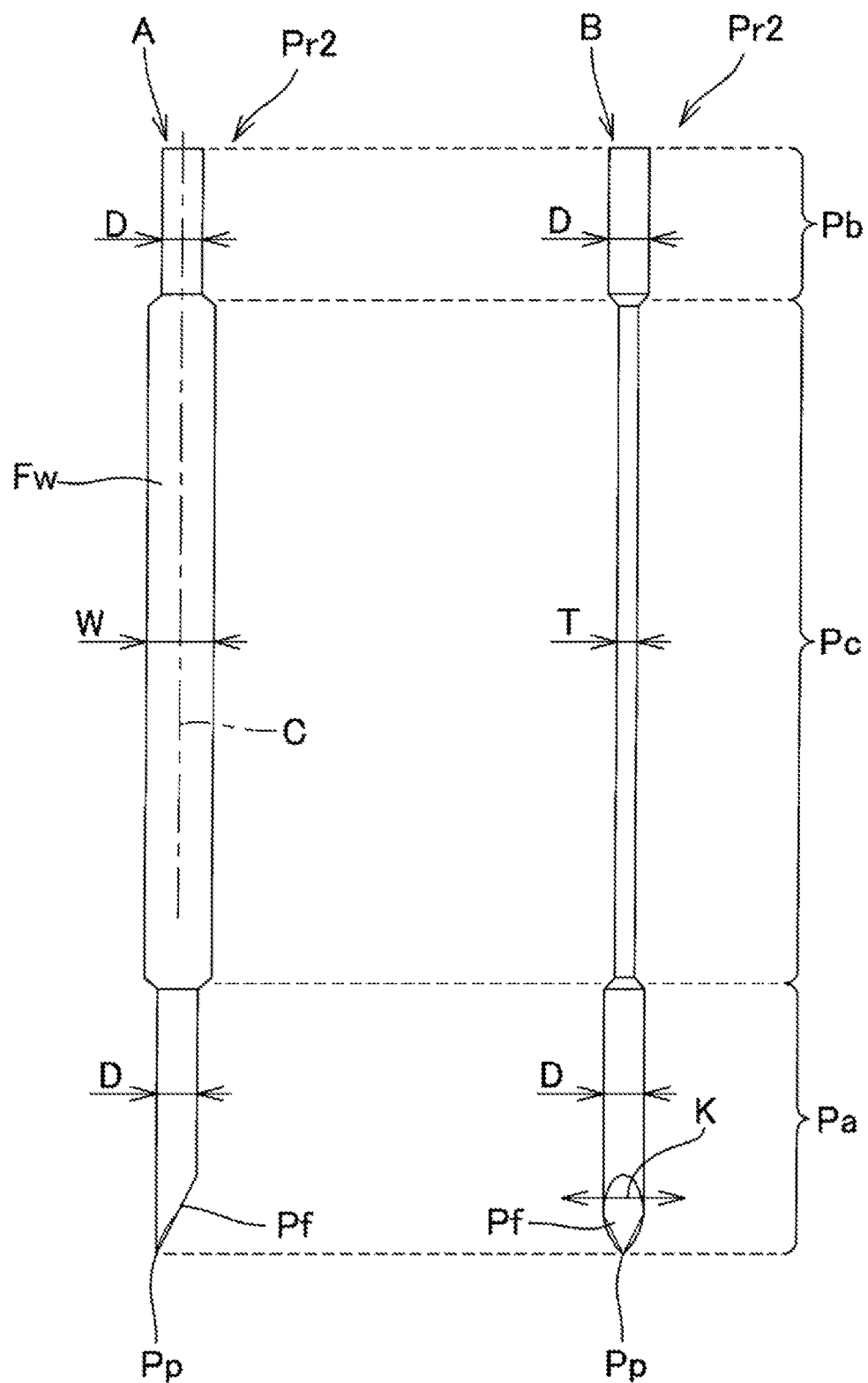
FIG. 4 is a front view and a side view of an example of the probe illustrated in FIGS. 1 and 2.

Each of FIGS. 3 and 4 illustrates a side view A and a front view B of each of probes Pr1 and Pr2 that are examples of the probe Pr illustrated in FIGS. 1 and 2. Hereinbelow, the probes Pr1 and Pr2 will collectively be referred to as a probe Pr as appropriate. The probe Pr illustrated in FIGS. 3 and 4 has a substantially bar-like shape as a whole. The probe Pr includes the distal end portion Pa with a substantially columnar shape, the base end portion Pb with a substantially columnar shape on an opposite side of the distal end portion Pa, and a main body portion Pc formed in a flat ribbon shape and extended to connect the distal end portion Pa to the base end portion Pb.

Each probe Pr may be used such that a portion obtained by working a wire material (wire) with a substantially columnar shape, for example, such as a metal material with conductivity, to be formed in a flat and ribbon shape through press working or the like is regarded as the main body portion Pc, and portions on both the sides thereof, which are not press worked, are regarded as the distal end portion Pa and the base end portion Pb. The distal end portion Pa is provided with a distal end surface Pf inclined relative to and intersecting with an axial center C (longitudinal direction) of the probe Pr.

The main body portion Pc is easy to be bent in a direction perpendicular to a wide width surface Fw (thickness T direction) and is hardly bent in a width W direction due to the flat and ribbon shape of the main body portion Pc.

A diameter D of each of the distal end portion Pa and the base end portion Pb ranges from 20 to 100 μm and is substantially 50 μm, for example. The width W of the main body portion Pc ranges from 50 to 110 μm and is substantially 70 μm, for example. The thickness T of the main body portion Pc ranges from 10 to 90 μm and is substantially 30 μm, for example.

In the probe Pr1 illustrated in FIG. 3, a width direction K of the distal end surface Pf is substantially equal (parallel) to the width W direction of the main body portion Pc formed in the ribbon shape. In the probe Pr2 illustrated in FIG. 4, the width direction K of the distal end surface Pf is substantially perpendicular to the width W direction of the main body portion Pc formed in the ribbon shape.

Figure 5:
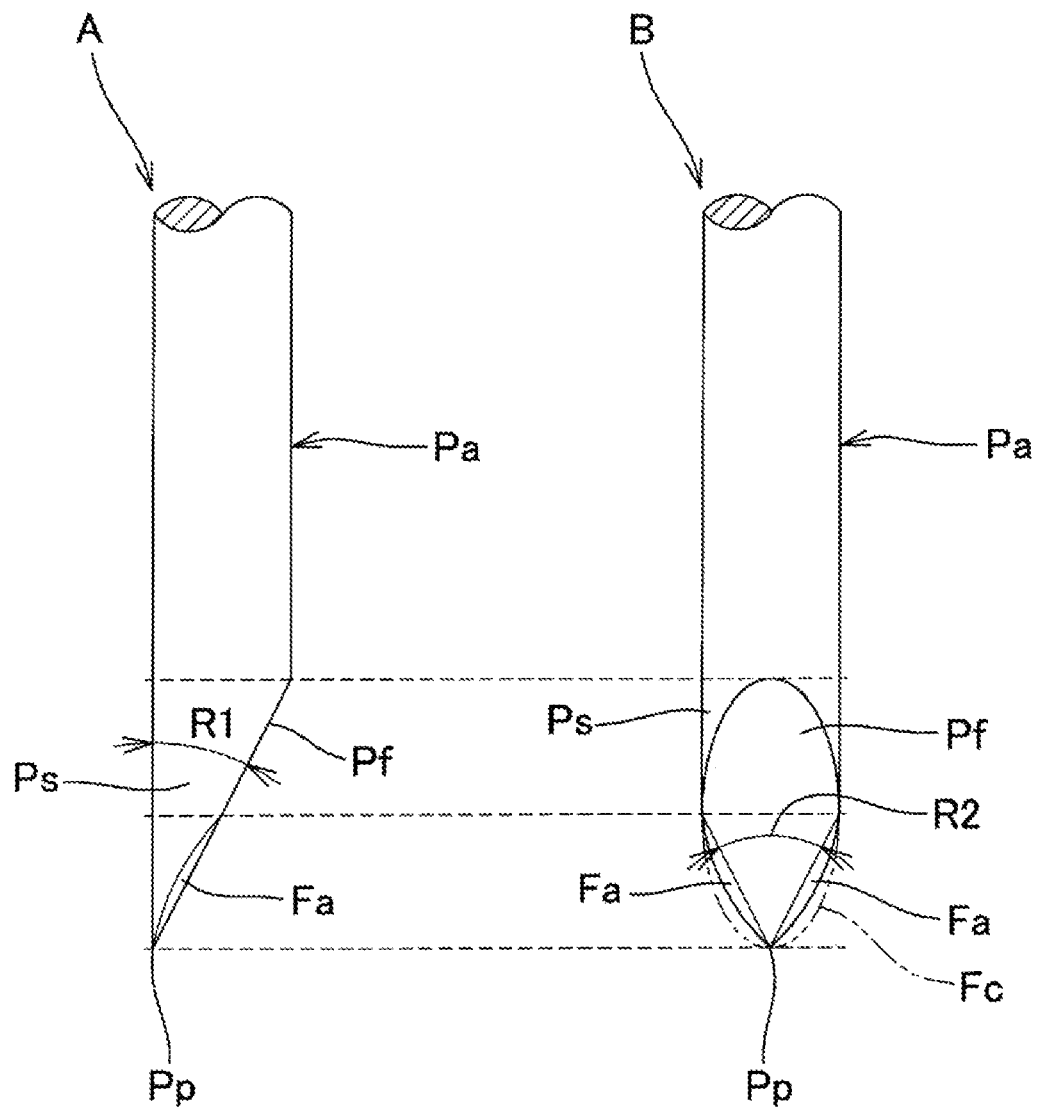
FIG. 5 is an enlarged view of distal end parts of the probes illustrated in FIGS. 3 and 4.

FIG. 5 is an enlarged view of the distal end parts of the distal end portions Pa in the probes Pr illustrated in FIGS. 3 and 4. On both edge portions on the lateral sides of the distal end surface Pf of the distal end portion Pa, chamfered surfaces Fa that communicate with a circumferential surface Ps of the distal end portion Pa and that are tapered are formed.

For example, the distal end surface Pf can be formed by cutting a distal end of the distal end portion Pa with a substantially columnar shape in an inclined manner to form an inclined surface Fc and chamfering corners of the inclined surface Fc to form the chamfered surfaces Fa.

Note that the distal end surface Pf may not necessarily be provided with the chamfered surfaces Fa. However, in a case in which the inclined surface Fc is used as the distal end surface Pf as it is, for example, thin and less-rigid parts are formed at the corners of the inclined surface Fc. For this reason, when the probe Pr is used for a board inspection, the less-rigid parts may be scraped off to cause an apex portion Pp of the distal end portion Pa that is to abut on the inspection point to be deformed, or the scraped parts may be particles, and the particles may contaminate the device under test 100. Accordingly, the distal end surface Pf is more preferably provided with the chamfered surfaces Fa.

An angle at the apex portion Pp between the chamfered surfaces Fa on both the sides of the distal end surface Pf ranges from 50 to 70 degrees and is substantially 60 degrees, for example.

Figure 6:
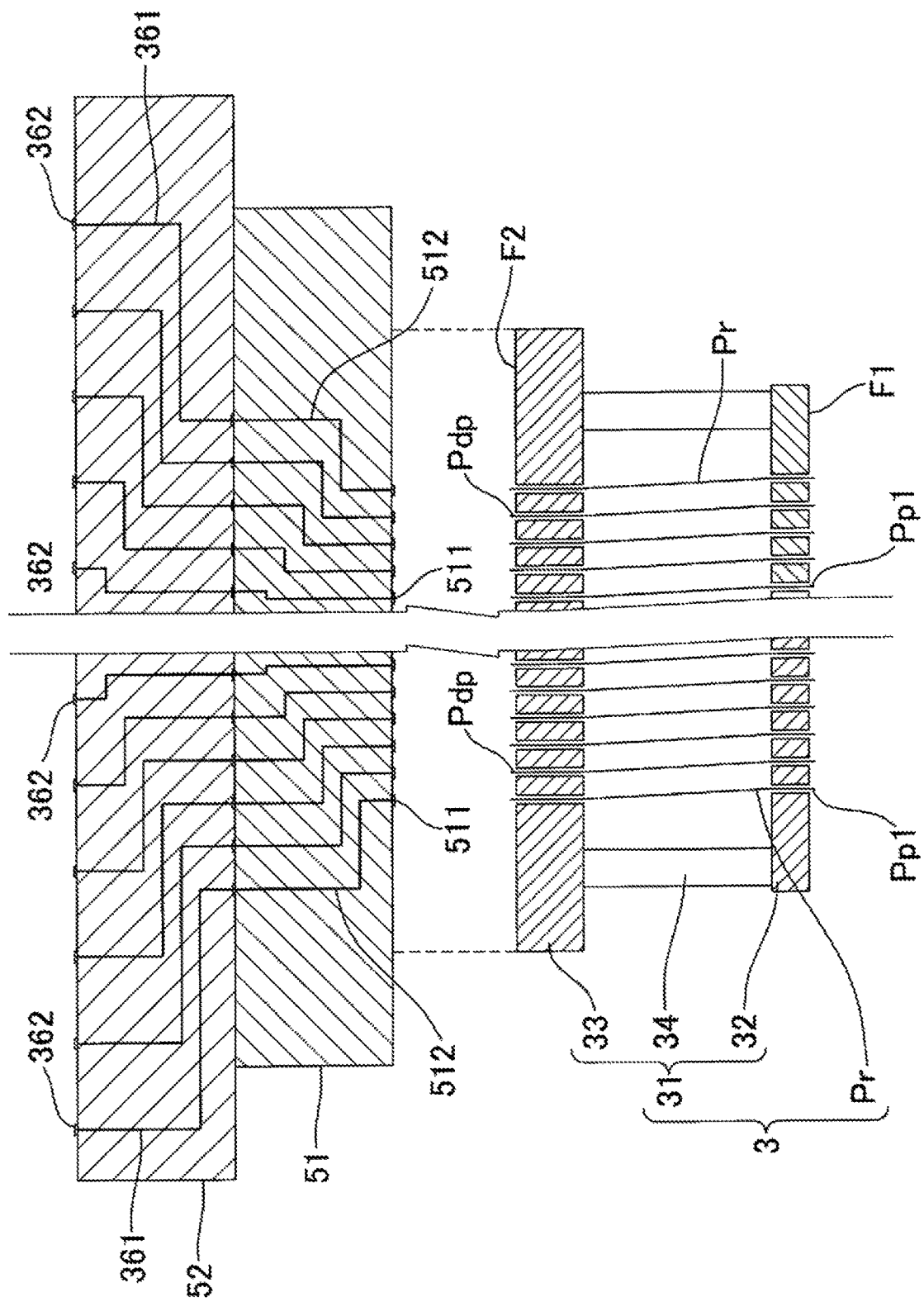
FIG. 6 is a cross-sectional view of the inspection jig illustrated in FIG. 1, a first pitch conversion block, and a second pitch conversion block.

FIG. 6 is a cross-sectional view of the inspection jig 3, the first pitch conversion block 51, and the second pitch conversion block 52 illustrated in FIG. 1. Note that, in a case of the inspection apparatus 1a illustrated in FIG. 2, the base plate 321 is attached instead of the first pitch conversion block 51 and the second pitch conversion block 52 illustrated in FIG. 6.

FIG. 6 illustrates the inspection jig 3 and the first pitch conversion block 51 in a separated state. An inspection-side support body 32 has a facing surface F1 arranged to face the device under test 100. An electrode-side support body 33 has a rear surface F2 that is brought into close contact with a lower surface of the first pitch conversion block 51. An apex portion Pdp of the base end portion Pb of the probe Pr slightly protrudes from the rear surface F2.

Each of the first pitch conversion block 51 and the second pitch conversion block 52 has a substantially cylindrical shape that is axially flattened, for example. A plurality of electrodes 511 are formed on the lower surface of the first pitch conversion block 51 that is brought into close contact with the rear surface F2 such that the electrodes 511 correspond to the arrangement of the apex portions Pdp of the respective probes Pr. A plurality of electrodes arranged at a wider pitch than the plurality of electrodes 511 are formed on the upper surface of the first pitch conversion block 51. The electrodes 511 on the lower surface and the electrodes on the upper surface of the first pitch conversion block 51 are connected to each other with wires 512.

A plurality of electrodes are formed on the lower surface of the second pitch conversion block 52 such that the electrodes correspond to the arrangement of the electrodes on the upper surface of the first pitch conversion block 51. A plurality of electrodes 362 formed corresponding to the arrangement of the electrodes on the aforementioned connection plate 53 are formed on the upper surface of the second pitch conversion block 52. The electrodes on the lower surface and the electrodes 362 on the upper surface of the second pitch conversion block 52 are connected to each other with wires 361.

In this manner, the inspection processing unit 8 can input and output a signal in and from each probe Pr by assembling the inspection jig 3, the first pitch conversion block 51, and the second pitch conversion block 52 and attaching the second pitch conversion block 52 to the connection plate 53.

The first pitch conversion block 51 and the second pitch conversion block 52 can be configured using multilayered interconnect boards such as a multi-layer organic (MLO) and a multi-layer ceramic (MLC).

Figure 7:
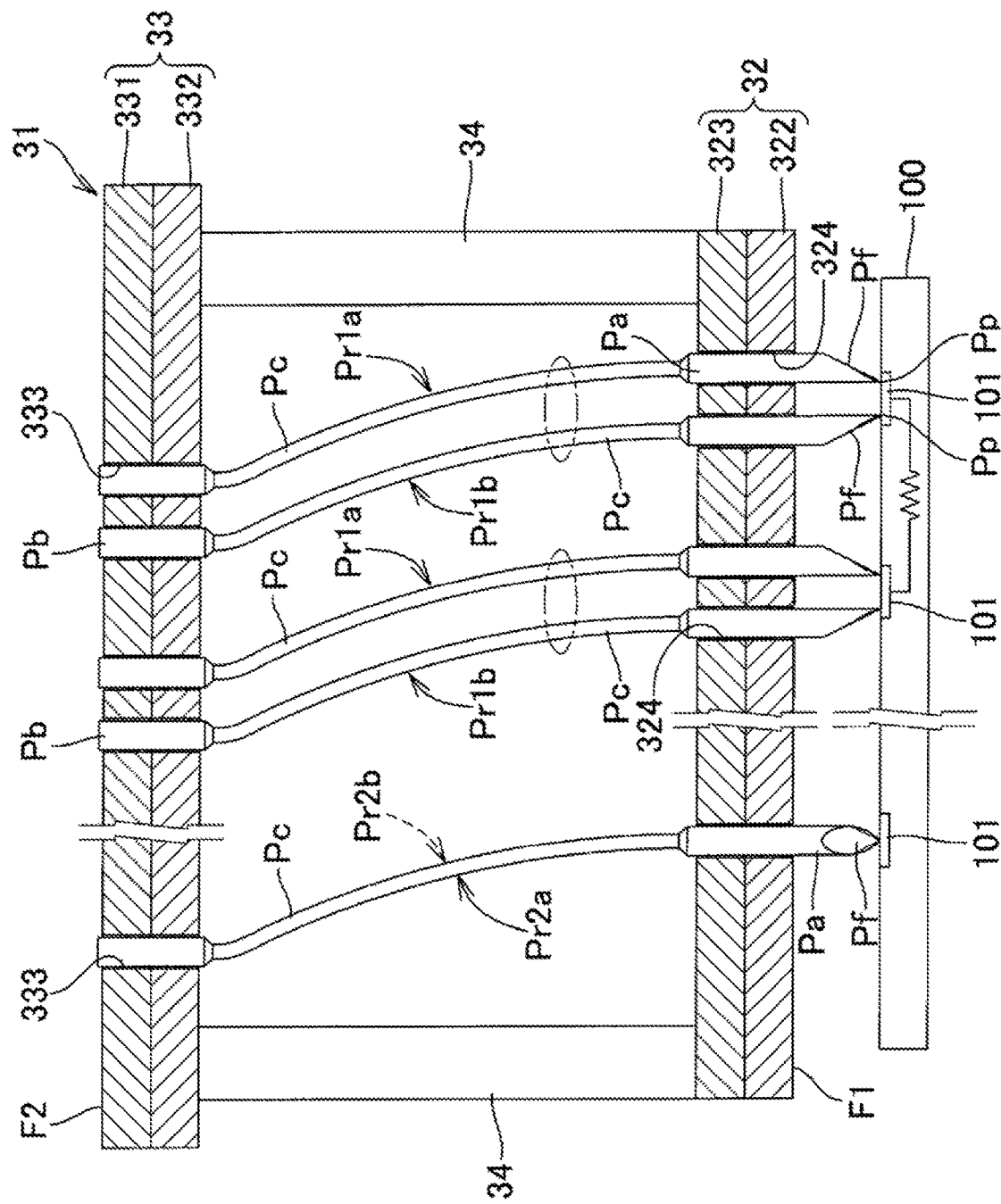
FIG. 7 is a cross-sectional view illustrating an example of a configuration of a support member and the probe in the inspection jig illustrated in FIGS. 1 and 2.

FIG. 7 is a cross-sectional view illustrating an example of a configuration of the support member 31 in the inspection jig 3 (3U) illustrated in FIGS. 1 and 2. FIG. 7 illustrates a cross-section obtained by cutting the support member 31 illustrated in FIGS. 1 and 2 along an X-Z plane. FIG. 7 illustrates a state in which the apex portion Pp of the probe Pr is brought into contact with an inspection point 101 of the device under test 100. Illustration of the support member 31 in the inspection jig 3U is omitted. Each of probes Pr1a and Pr1b illustrated in FIG. 7 is the aforementioned probe Pr1, and each of probes Pr2a and Pr2b is the aforementioned probe Pr2.

The support member 31 includes the inspection-side support body 32 that is disposed to face the device under test 100, the electrode-side support body 33 that is disposed at a side opposite to the device under test 100 side of the inspection-side support body 32 to face the inspection-side support body 32, and a linking member 34 that holds the inspection-side support body 32 and the electrode-side support body 33 parallel to each other with a predetermined distance therebetween.

The inspection-side support body 32 is configured by a facing plate 322 and a guide plate 323 being laminated. The facing plate 322 has the facing surface F1 arranged to face the device under test 100. The facing plate 322 is integrally secured to the guide plate 323 with a detachable securing means such as a bolt.

A plurality of probe insertion holes 324 into which the distal end portions Pa of the probes Pr are inserted are formed in the inspection-side support body 32. Each probe insertion hole 324 guides the apex portion Pp of each probe Pr to each of the plurality of inspection points 101 provided on the device under test 100.

The electrode-side support body 33 is configured such that a support plate 331 and a spacer plate 332 are laminated in this order from the side opposite to the facing surface F1. The surface of the support plate 331 on the side opposite to the facing surface F1 is regarded as the rear surface F2. A plurality of probe support holes 333 corresponding to the plurality of probe insertion holes 324 are formed in the electrode-side support body 33. The base end portions Pb of the probes Pr are inserted into the probe support holes 333. The distal ends of the base end portions Pb slightly protrudes from the rear surface F2. In this manner, the base end portions Pb of the respective probes Pr are caused to abut on the aforementioned electrodes such that the base end portions Pb can be connected to the inspection processing unit 8 in a conductive manner.

The plurality of probes Pr are paired with two probes as a pair. One of the paired probes Pr is used as a probe for current supply while the other is used as a probe for voltage measurement in the four-point probe method. In FIG. 7, the two probes Pr1a and Pr1b circled with the dashed line are paired, and the two probes Pr2a and Pr2b are paired.

The probes Pr1a and Pr1b as a pair are adjacent to each other in the direction of the X axis. The probes Pr2a and Pr2b as a pair are adjacent to each other in a depth direction on the sheet surface in FIG. 7 (direction of the Y axis), and the probe Pr2b is hidden behind the probe Pr2a.

The probes Pr1a and Pr1b as a pair are slightly spaced to each other by the support member 31 and are held in a direction in which the probes Pr1a and Pr1b are adjacent to each other such that the apex portions Pp of the distal end surfaces Pf may be closest to each other. The probes Pr2a and Pr2b as a pair are slightly spaced to each other by the support member 31 and are held in a direction in which the probes Pr2a and Pr2b are adjacent to each other such that the apex portions Pp of the distal end surfaces Pf may be closest to each other.

Each of the probe insertion holes 324 and each of the probe support holes 333 that correspond to each other are arranged at positions deviating as much as a predetermined distance in a direction parallel to the facing surface F1 (direction perpendicular to the Z axis). In this manner, the probe Pr in which the base end portion Pb and the distal end portion Pa are respectively inserted in the probe insertion hole 324 and the probe support hole 333 that correspond to each other is curved due to the deviation.

The probe Pr causes spring properties by being curved. As a result, it is possible to cause the apex portion Pp of the probe Pr to be in elastic contact with the inspection point 101 and thereby to improve contact stability.

As described above, the main body portion Pc of the probe Pr is easy to be bent in the direction perpendicular to the wide width surface Fw (thickness T direction) and is hardly bent in the width W direction due to the flat and ribbon shape of the main body portion Pc. Thus, when the probes Pr are curved due to the deviation of the probe insertion holes 324 from the probe support holes 333, the directions of the probes Pr are aligned substantially automatically such that the wide width surfaces Fw may be perpendicular to the direction of the deviation of the probe insertion holes 324 from the probe support holes 333.

Accordingly, as illustrated in FIG. 7, in a case in which the probes Pr1a and Pr1b as a pair are adjacent to each other in the deviation direction (direction of the X axis), are inserted into the support member 31, and are bent in a state in which the directions thereof are aligned to be adjacent to each other such that the apex portions Pp of the distal end surfaces Pf may be closest to each other, the probes Pr1a and Pr1b thereafter keep the directions and do not turn. Thus, the probes Pr1a and Pr1b can easily be held in the direction in which the probes Pr1a and Pr1b are adjacent to each other such that the apex portions Pp of the distal end surfaces Pf may be closest to each other.

Similarly, in a case in which the probes Pr2a and Pr2b as a pair are adjacent to each other in a direction perpendicular to the deviation direction (direction of the Y axis), are inserted into the support member 31, and are bent in a state in which the directions thereof are aligned to be adjacent to each other such that the apex portions Pp of the distal end surfaces Pf may be closest to each other, the probes Pr2a and Pr2b thereafter keep the directions and do not turn. Thus, the probes Pr2a and Pr2b can easily be held in the direction in which the probes Pr2a and Pr2b are adjacent to each other such that the apex portions Pp of the distal end surfaces Pf may be closest to each other.

In a case in which the probes Pr1a and Pr1b as a pair and the probes Pr2a and Pr2b as a pair are held in the directions in which the probes Pr1a and Pr1b and the probes Pr2a and Pr2b are adjacent to each other such that the apex portions Pp of the distal end surfaces Pf may be closest to each other, the distance between the apex portions Pp of the probes Pr1a and Pr1b as a pair is shorter than the distance between the axial centers of the probes Pr1a and Pr1b as illustrated in FIG. 7. Similarly, the distance between the apex portions Pp of the probes Pr2a and Pr2b as a pair is shorter than the distance between the axial centers of the probes Pr2a and Pr2b. As a result, two probes Pr can easily be brought into contact with the fine inspection point 101.

Note that the support member 31 has only to support the pair of probes Pr in the direction in which the probes Pr are adjacent to each other such that the apex portions Pp of the distal end surfaces Pf may be closest to each other. In the probe Pr, the width direction K of the distal end surface Pf may not necessarily be substantially equal (parallel) to the width W direction of the main body portion Pc formed in the ribbon shape as in the case of the probe Pr1, and the width direction K of the distal end surface Pf may not necessarily be substantially perpendicular to the width W direction of the main body portion Pc formed in the ribbon shape as in the case of the probe Pr2.

However, by using the probe Pr1 or Pr2 as the probe Pr, the probes Pr as a pair have only to be arranged in the parallel (direction of the X axis) or perpendicular (direction of the Y axis) to the deviation direction (bent direction) by means of the support member 31. Hence, the support member 31 can easily hold the probes Pr in the direction in which the probes Pr are adjacent to each other such that the apex portions Pp of the distal end surfaces Pf may be closest to each other.

Also, each of the probes Pr1 and Pr2 illustrated in FIGS. 3 and 4 may not necessarily be curved by the positional deviation of the probe insertion holes 324 from the probe support holes 333. Each of the probes Pr1 and Pr2 may be subject to a curving process in advance and may then be attached to the support member 31 as the probes Pr1a, Pr1b, Pr2a, and Pr2b illustrated in FIG. 7.

Figure 8:
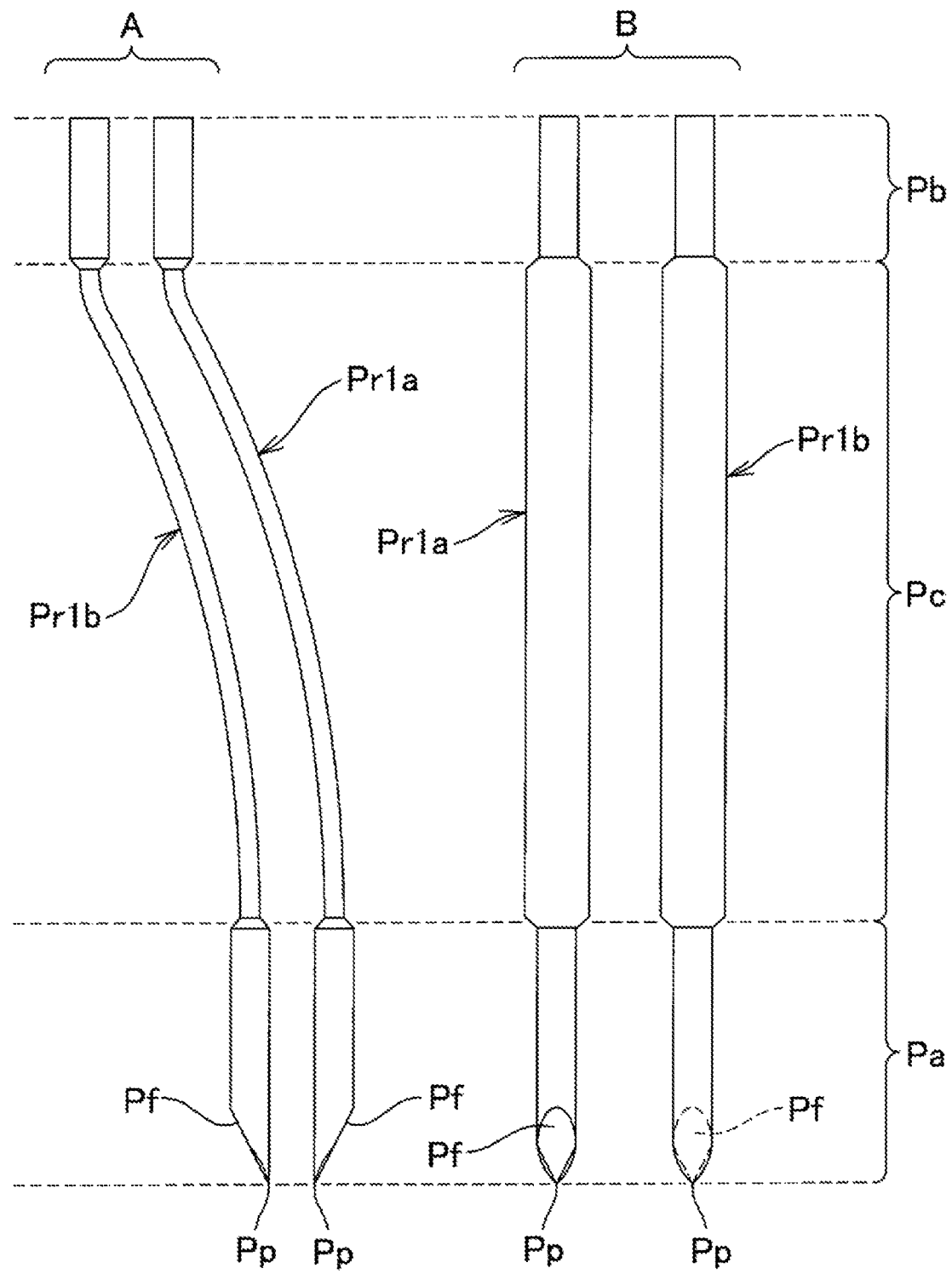
FIG. 8 is a front view and a side view illustrating an example of a probe subject to a curving process in advance.
Figure 9:
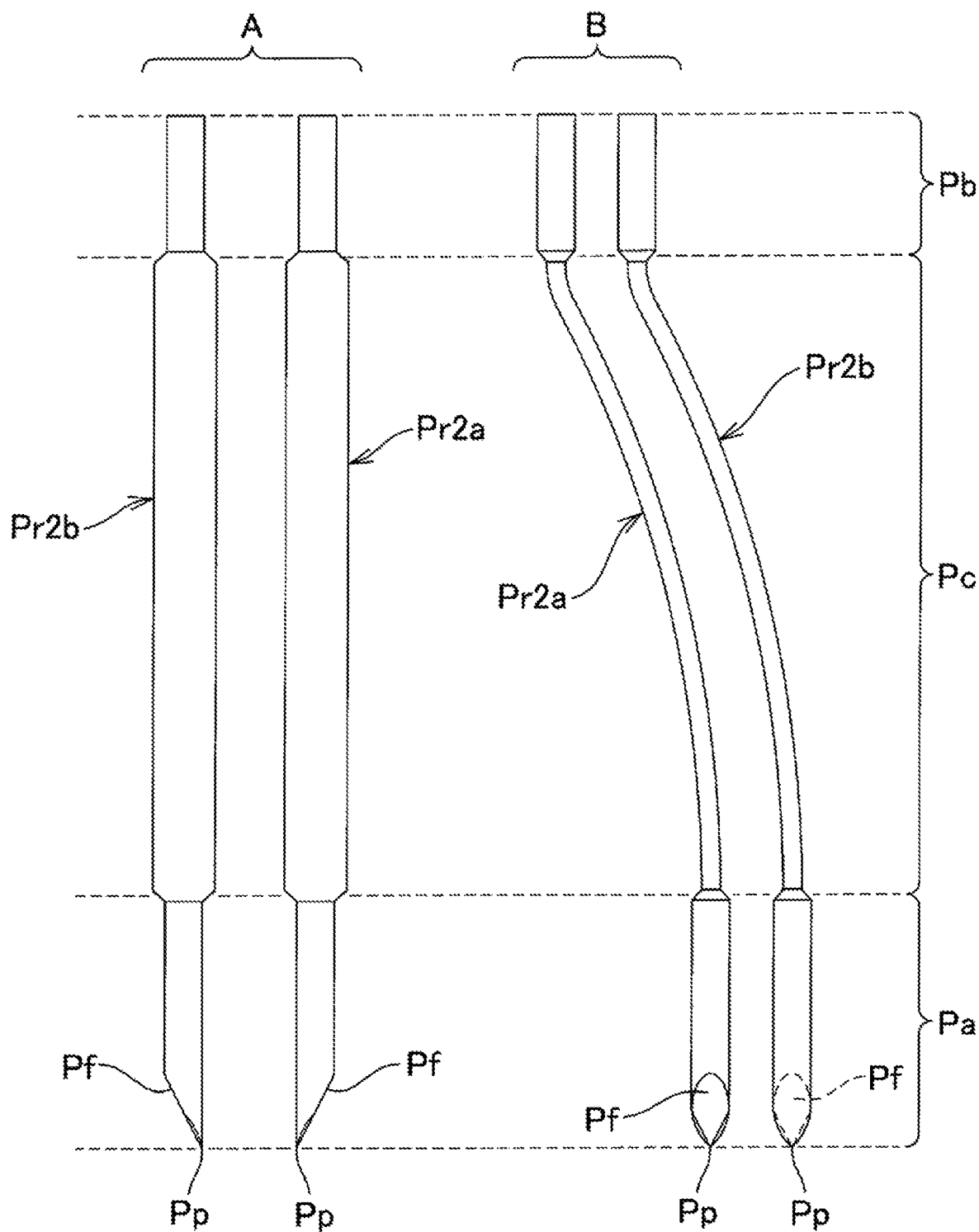
FIG. 9 is a front view and a side view illustrating an example of the probe subject to the curving process in advance.

FIGS. 8 and 9 are side views A and front views B illustrating the probes Pr1a, Pr1b, Pr2a, and Pr2b subject to the curving process in advance. As illustrated in FIG. 7, in a state in which the probes Pr1a and Pr1b as a pair are curved in the same direction, the distal end surfaces Pf face in opposite directions to each other. Similarly, in a state in which the probes Pr2a and Pr2b as a pair are curved in the same direction, the distal end surfaces Pf face in opposite directions to each other.

Accordingly, the main body portions Pc of the probes Pr1a and Pr1b are subject to the curving process such that the distal end surfaces Pf face in opposite directions to each other as illustrated in FIG. 8. Similarly, the main body portions Pc of the probes Pr2a and Pr2b are subject to the curving process such that the distal end surfaces Pf face in opposite directions to each other as illustrated in FIG. 9.

As for the curving process of the main body portion Pc, the main body portion Pc can be curved with use of a mold having the curved main body portion Pc at the same time as press working of the main body portion Pc in a flat and ribbon shape.

By processing the probes Pr1a, Pr1b, Pr2a, and Pr2b to cause the main body portions Pc to be curved in advance, at the time of assembling the support member 31, the distal end surfaces Pf of the probes Pr1a, Pr1b, Pr2a, and Pr2b can be assembled in the correct direction in which the probes are adjacent to each other such that the apex portions Pp may be closest to each other.

Also, when pressure is applied to the apex portions Pp of the probes Pr1a, Pr1b, Pr2a, and Pr2b when the apex portions Pp are brought into pressure contact with the inspection points 101 to inspect the device under test 100, forces to rotate the probes Pr1a, Pr1b, Pr2a, and Pr2b may be exerted. Even in such a case, forming the main body portions Pc in curved shapes in advance restricts the probes Pr1a, Pr1b, Pr2a, and Pr2b from being rotated.

Consequently, at the time of contact of the apex portion Pp with the inspection point 101, it is possible to prevent the apex portion Pp from moving, prevent the contact from being unstable, and prevent the direction of the distal end surface Pf from being changed, and the stability when the apex portion Pp is brought into contact with the inspection point 101 is improved while holding the distal end surface Pf in the correct direction.

The inspection processing unit 8 includes, for example, a power supply circuit, a voltmeter, an ammeter, and a microcomputer. In control of the not-illustrated driving mechanism, the inspection processing unit 8 moves and positions the inspection units 4U and 4D and brings the pair of probes Pr1a and Pr1b or the pair of probes Pr2a and Pr2b into contact with each inspection point 101 of the device under test 100. In this manner, the probe for current supply and the probe for voltage measurement in the four-point probe method are brought into contact with each inspection point 101, and the inspection point 101 and the inspection processing unit 8 are electrically connected via the probe Pr.

In this state, the inspection processing unit 8 supplies current between the two inspection points 101 of the measurement target via the probes for current supply and measures voltage between the two inspection points 101 via the probes for voltage measurement. A resistance value between the two inspection points 101 is calculated by Ohm's law based on the supplied current and the measured voltage. The inspection processing unit 8 executes the inspection of the device under test 100 by detecting the resistance value between the respective inspection points 101 in this manner.

Figure 10:
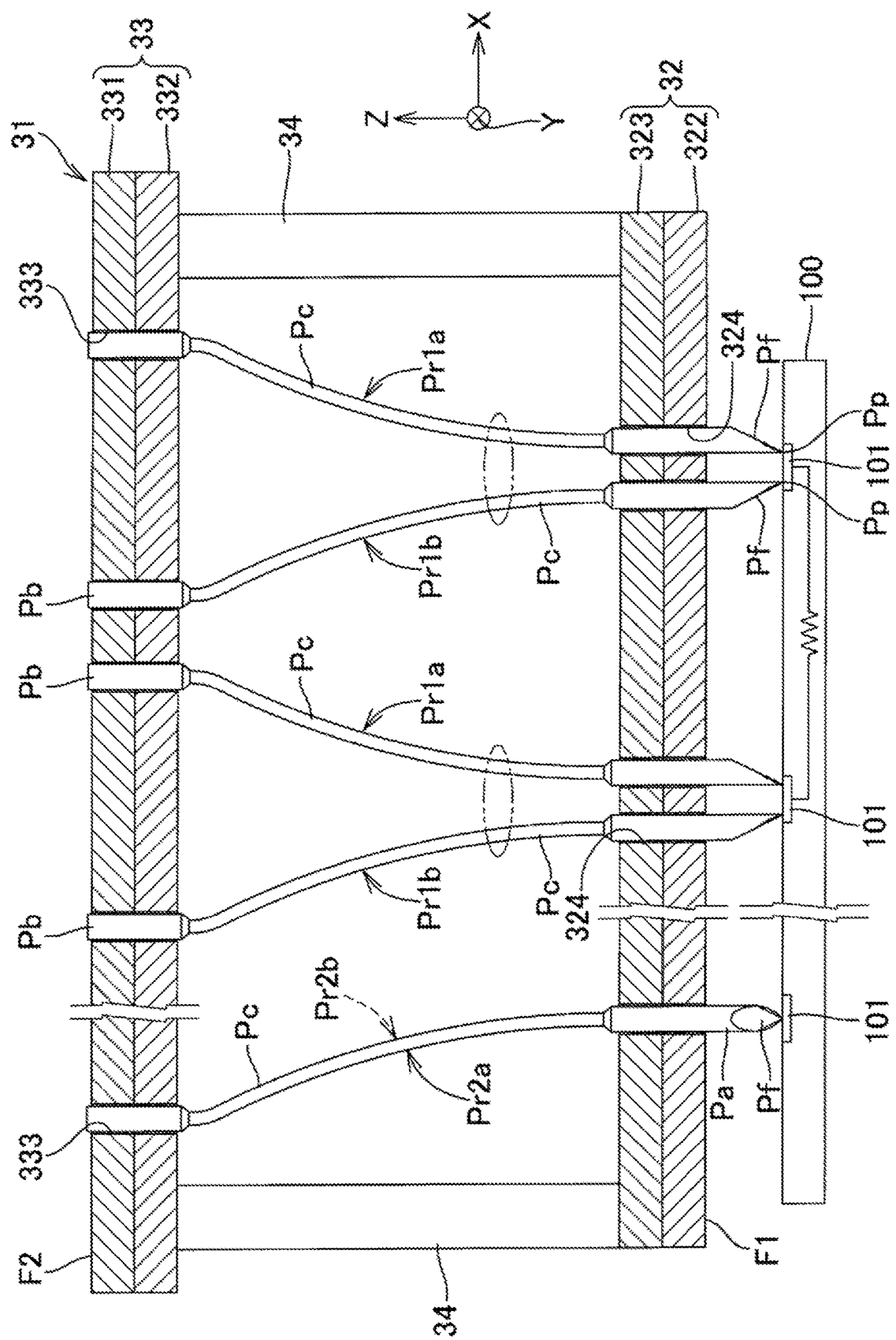
FIG. 10 is a cross-sectional view illustrating another example of the support member and the probe illustrated in FIG. 7.

FIG. 10 is a cross-sectional view illustrating another example of a configuration of the support member 31 and the probes Pr1a and Pr1b illustrated in FIG. 7 and illustrates another example of a configuration of the probes Pr1a and Pr1b illustrated in FIG. 8. As illustrated in FIG. 10, the probes Pr1a and Pr1b may be curved in directions in which the distance between the probes Pr1a and Pr1b increases further at closer positions to the base end portions Pb. Even in a case in which the probes Pr1a and Pr1b are formed as illustrated in FIG. 10, the probes Pr1a and Pr1b can exert similar effects to those of the probes Pr1a and Pr1b illustrated in FIGS. 7 and 8.

Second Embodiment

Next, an inspection apparatus 1b according to a second embodiment of the present invention will be described. The inspection apparatus 1b is a semiconductor inspection apparatus or a board inspection apparatus, for example, and is illustrated in FIGS. 1 and 2 in similar manners to the inspection apparatuses 1 and 1a. The inspection apparatus 1b differs from the inspection apparatus 1a in terms of the configuration of a support member 31a and the shape of the probe Pr. The inspection apparatus 1b is otherwise similar in structure to the inspection apparatuses 1 and 1a, and description of common features will be omitted. Characteristic aspects of the present embodiment will be described below.

Figure 11:
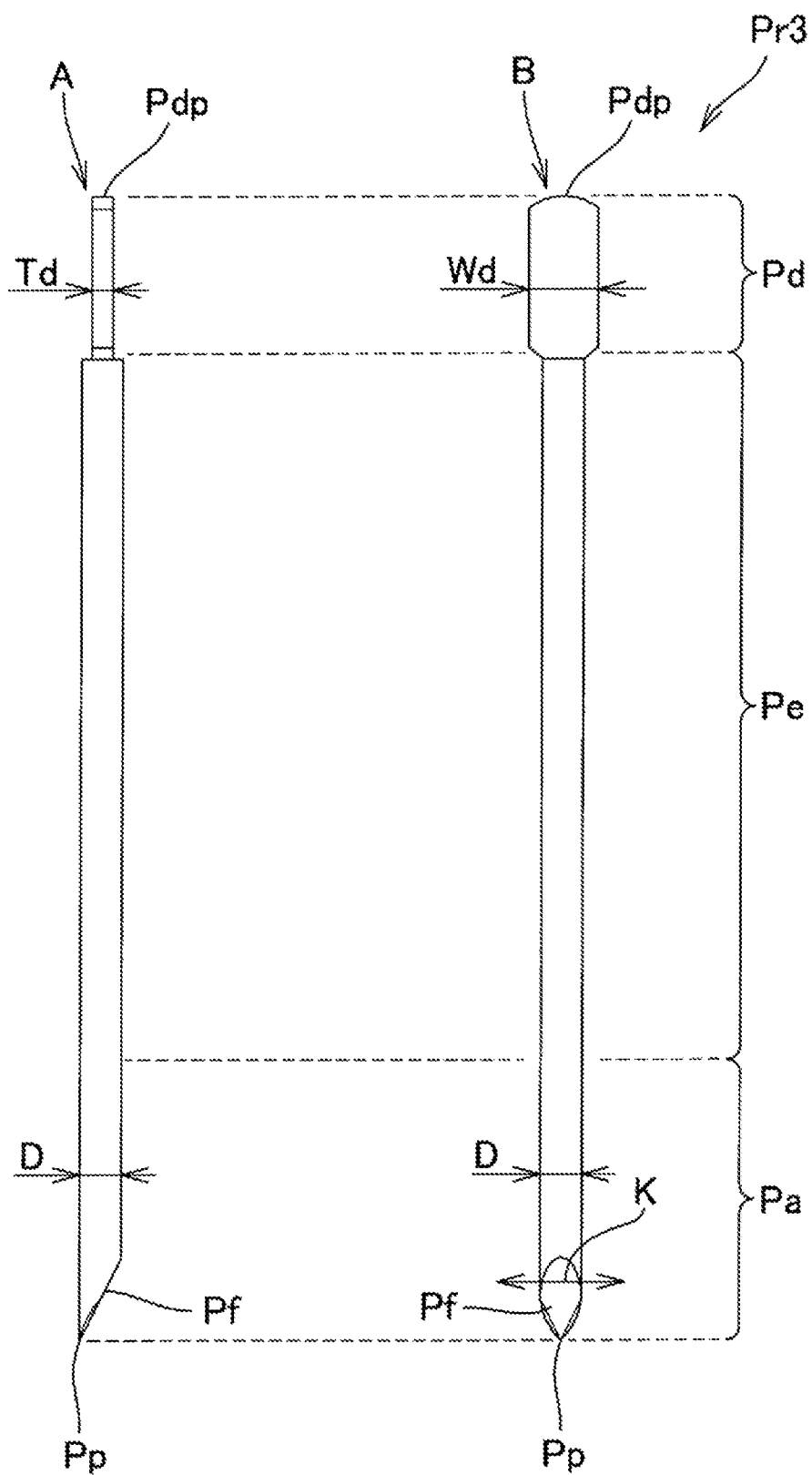
FIG. 11 is a front view and a side view of another example of the probe illustrated in FIGS. 1 and 2.

FIG. 11 illustrates a side view A and a front view B of a probe Pr3 that is an example of the probe Pr illustrated in FIGS. 1 and 2. The probe Pr3 illustrated in FIG. 11 has a substantially bar-like shape as a whole. The probe Pr includes the distal end portion Pa with a substantially columnar shape, a base end portion Pd on an opposite side of the distal end portion Pa, and a main body portion Pe extended to connect the distal end portion Pa to the base end portion Pd. The main body portion Pe is formed in a substantially columnar and bar-like shape, for example.

The base end portion Pd is formed in a flat shape with a dimension in a width direction (width Wd) perpendicular to an axial center being larger than a thickness Td in a thickness direction perpendicular to the width direction and the axial center. The width Wd can be approximately 110 μm, for example, and the thickness Td can be approximately 35 μm, for example. The width direction K of the distal end surface Pf and the direction of the width Wd of the base end portion Pd are in a substantially equal direction. An apex portion Pdp of the base end portion Pd is in a curved shape, for example. Meanwhile, the shape of the apex portion Pdp can be any of various shapes and is not limited to a specific shape.

Figure 12:
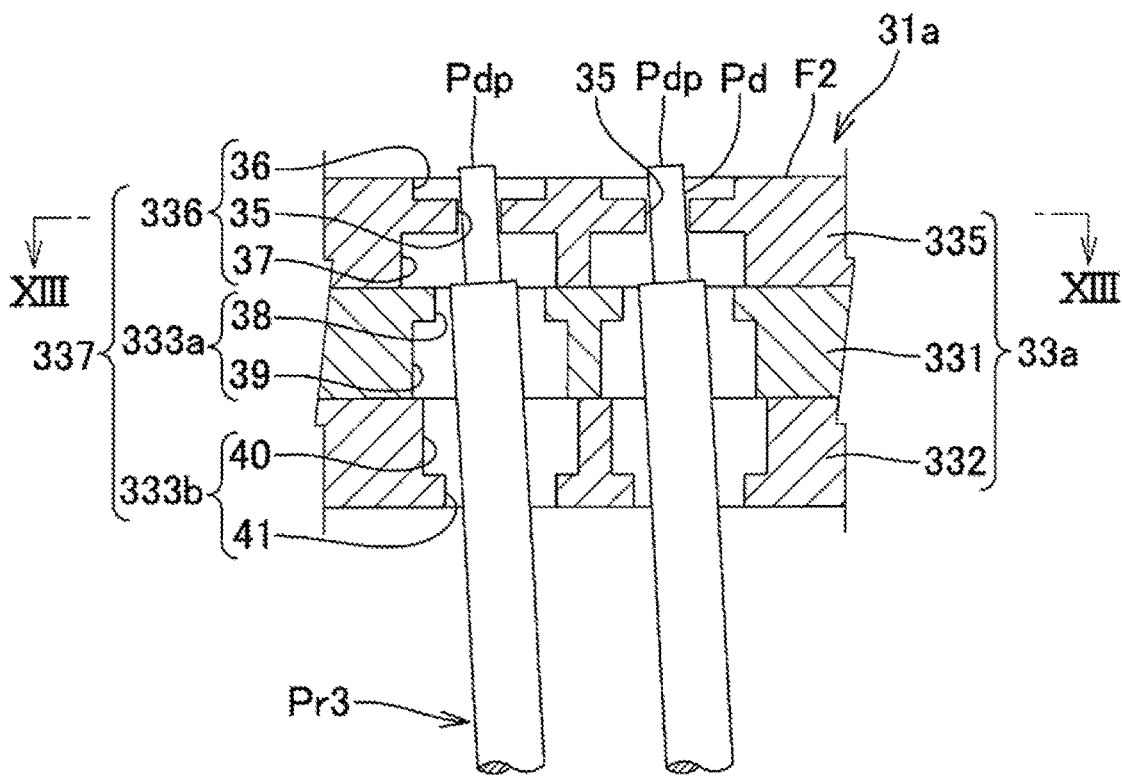
FIG. 12 is a cross-sectional view illustrating another example of a configuration of the support member and the probe illustrated in FIG. 7.
Figure 12:
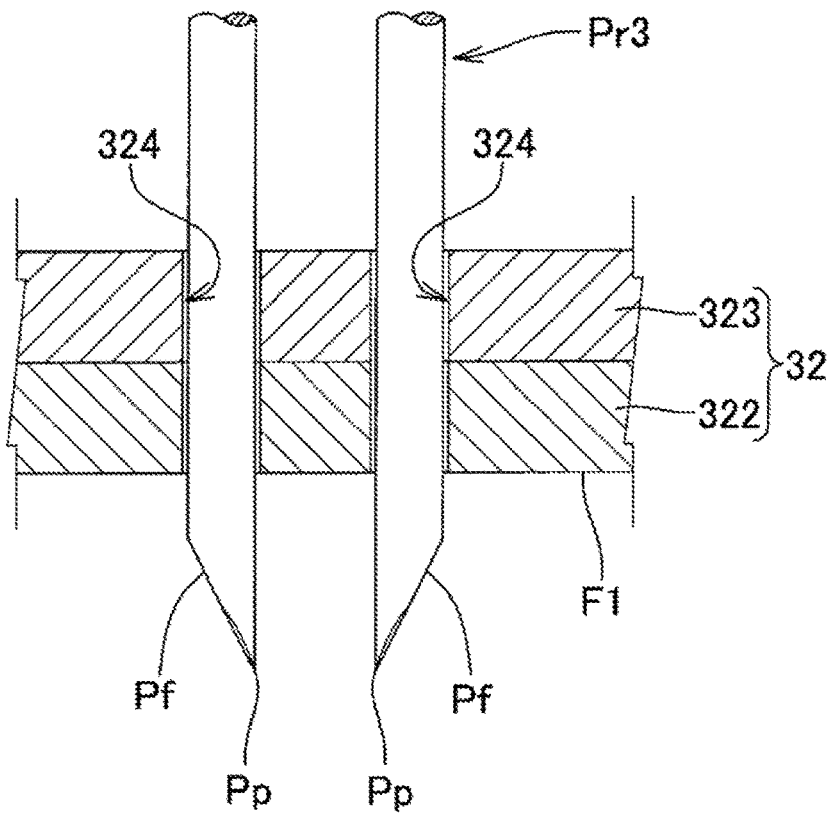

FIG. 12 is a cross-sectional view illustrating another example of a configuration of the support member and the probe illustrated in FIG. 7. FIG. 12 illustrates a partial cross-section obtained by cutting the support member 31a illustrated in FIGS. 1 and 2 along the X-Z plane.

In the support member 31a illustrated in FIG. 12, the configuration of an electrode-side support body 33a differs from that of the electrode-side support body 33 in the support member 31. The support member 31a is otherwise similar in structure to the support member 31, and description of common features will be omitted. Characteristic aspects of the electrode-side support body 33a will be described below.

The electrode-side support body 33a is configured such that a restriction plate 335, the support plate 331 and the spacer plate 332 are laminated in this order from the side opposite to the facing surface F1. The surface of the restriction plate 335 on the side opposite to the facing surface F1 is regarded as the rear surface F2.

A plurality of through holes 336 corresponding to the plurality of probe insertion holes 324 are formed in the restriction plate 335. A plurality of probe support holes 333a corresponding to the plurality of probe insertion holes 324 are formed in the support plate 331. A plurality of probe support holes 333b corresponding to the plurality of probe insertion holes 324 are formed in the spacer plate 332. Each of the probe support holes 333a and each of the probe support holes 333b communicate with each other and form the probe support hole 333.

In a communication hole 337 obtained by causing the through hole 336, the probe support hole 333a, and the probe support hole 333b to be arranged to communicate with each other, the probe Pr3 can be inserted. The through hole 336, the probe support hole 333a, and the probe support hole 333b are arranged in a state in which the centers thereof are slightly misaligned. In this manner, the entire communication hole 337 is formed to be inclined against the perpendicular direction to the facing surface F1. As a result, a region around the base end portion Pd of the probe Pr3 inserted in the communication hole 337 is inclined against the perpendicular direction to the facing surface F1.

The probe Pr3 is inserted into the communication hole 337 and the probe insertion hole 324 and is supported by the support member 31a in an inclined state so as to be bent easily. The adjacent probes Pr3 as a pair are slightly spaced to each other by the support member 31a and are held in a direction in which the probes Pr3 are adjacent to each other such that the apex portions Pp of the distal end surfaces Pf may be closest to each other.

Note that the probe Pr3 may not necessarily be inclined, and the center positions of the through hole 336, the probe support hole 333a, and the probe support hole 333b may correspond. Also, the center positions of the communication hole 337 and the probe insertion hole 324 may correspond.

The through hole 336 is configured such that a spacer hole 36, a restriction hole 35, and a large-diameter hole 37 concentrically communicate in this order from the side of the rear surface F2.

Figure 13:
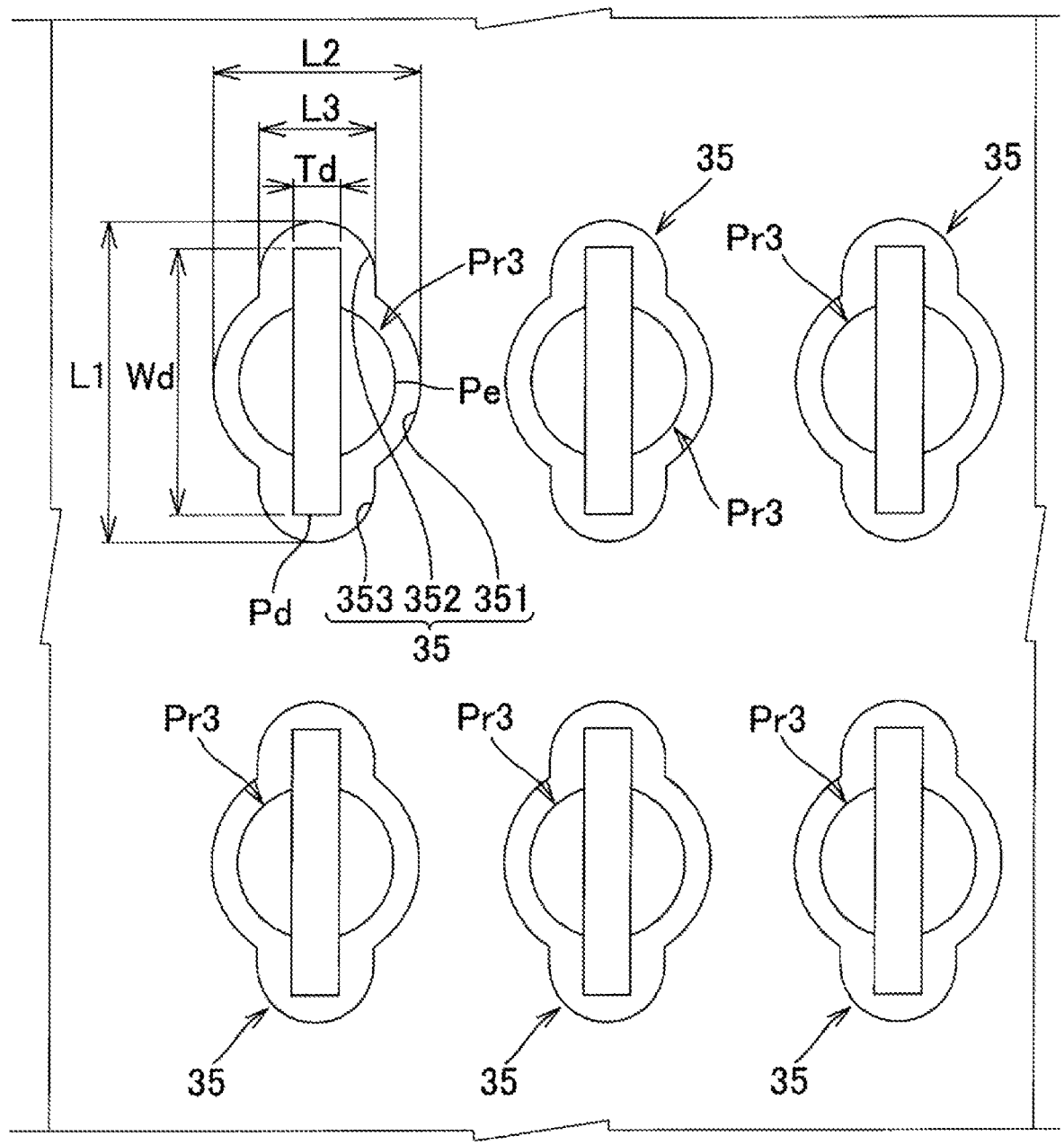
FIG. 13 is a cross-sectional view along the line XIII-XIII in FIG. 12.

FIG. 13 is a cross-sectional view along the line XIII-XIII in FIG. 12. The restriction hole 35 illustrated in FIG. 13 includes a hole main body portion 351, an extended hole portion 352 provided by denting a portion of an inner wall surface of the hole main body portion 351 in a shape of a semi-cylinder having a shorter diameter than that of the hole main body portion 351, and an extended hole portion 353 provided by denting a portion of the inner wall surface of the hole main body portion 351 on an opposite side of the extended hole portion 352 in a shape of a semi-cylinder having a shorter diameter than that of the hole main body portion 351.

FIG. 13 illustrates a cross-section of a state in which the base end portion Pd is inserted into the extended hole portion 352 of the restriction hole 35.

An opposed direction in which the extended hole portion 352 and the extended hole portion 353 are opposed corresponds to an example of a first direction while a direction perpendicular to the opposed direction and a depth direction of the restriction hole 35 corresponds to an example of a second direction. A length L1 in the first direction in the restriction hole 35 is longer than the width Wd of the base end portion Pd. A length L2 in the second direction in the restriction hole 35 is shorter than the width Wd and is longer than a diameter D or a maximum width of the main body portion Pe. A width L3 of each of the extended hole portions 352 and 353 is longer than the thickness Td of the base end portion Pd.

Since the length L1 is longer than the width Wd, and the width L3 is longer than the thickness Td, both the end portions of the base end portion Pd in the width direction can be received by the extended hole portions 352 and 353. Also, the length L2 of the restriction hole 35 is shorter than the width Wd. Thus, when the probe Pr3 is to be rotated in a state in which both the end portions of the base end portion Pd in the width direction are received in the extended hole portions 352 and 353, the base end portion Pd and the inner walls of the extended hole portions 352 and 353 interfere with each other.

As a result, since rotation of the probe Pr3 supported by the communication hole 337 and the probe insertion hole 324 is prevented, the support member 31a can easily arrange the probes Pr3 as a pair in a direction in which the probes Pr3 are adjacent to each other such that the apex portions Pp of the distal end surfaces Pf may be closest to each other. In a case in which the probes Pr3 as a pair can be arranged such that the apex portions Pp may be closest to each other, it is easy to bring two probes into contact with a fine inspection point.

Also, since the length L2 is longer than the diameter D, the distal end portion Pa of the probe Pr3 can be inserted in the restriction hole 35 from the side of the rear surface F2, the main body portion Pe can pass through the restriction hole 35, the probe Pr3 can further be inserted, and the base end portion Pd can be located inside the restriction hole 35. Thus, the inspection jig can be assembled easily.

Note that the length L2 may be shorter than the diameter D of the main body portion Pe. In this case, the base end portion Pd of the probe Pr3 may be inserted into the restriction hole 35 from an opposite side of the rear surface F2.

Note that the width direction K of the distal end surface Pf and the direction of the width Wd of the base end portion Pd may not be in a substantially equal direction. However, in a case in which the width direction K of the distal end surface Pf and the direction of the width Wd of the base end portion Pd are not in a substantially equal direction, the width Wd, which is longer than the diameter D of the main body portion Pe, faces in the direction in which the probes Pr3 as a pair are adjacent. Thus, to avoid interference between the base end portions Pd, the distance between the adjacent probes Pr3 needs to be extended. For this reason, it is difficult to bring a pair of probes Pr3 into contact with a pair of inspection points having a short adjacent distance.

Accordingly, it is more preferable to cause the width direction K of the distal end surface Pf and the direction of the width Wd of the base end portion Pd to be in a substantially equal direction in that such a configuration facilitates shortening of the adjacent distance between the probes Pr3 as a pair (adjacent distance in the right-left direction in FIG. 13).

Also, since the spacer hole 36 is provided, the restriction hole 35 is located at a position away from the rear surface F2 by a predetermined distance equivalent to the depth of the spacer hole 36, that is, at a position of the base end portion Pd further away from the apex portion Pdp. As a result, compared with a case in which rotation of the probe Pr3 is restricted at a position almost around the apex portion Pdp, a possibility that the base end portion Pd drops out of the restriction hole 35 and that the probe Pr3 is rotated is reduced. The depth of the spacer hole 36 or the predetermined distance can be approximately 0.2 mm, for example.

Note that the restriction plate 335 may not include the spacer hole 36, and the restriction hole 35 may penetrate the restriction plate 335. Also, each of the probe support holes 333a and 333b may be a hole penetrating each plate with a uniform hole diameter. Also, the electrode-side support body 33a may not include the support plate 331 and the spacer plate 332 and may include only the restriction plate 335.

The probe support hole 333a is configured such that a small-diameter portion 38 and a large-diameter portion 39 having a larger diameter than that of the small-diameter portion 38 concentrically communicate in this order from the side of the restriction plate 335. The probe support hole 333b is configured such that a large-diameter portion 40 and a small-diameter portion 41 having a smaller diameter than that of the large-diameter portion 40 concentrically communicate in this order from the side of the support plate 331.

Note that the main body portion Pe in the probe Pr3 may be replaced with the main body portion Pc formed in the flat and ribbon shape. The probe Pr3 in which the main body portion Pe is replaced with the main body portion Pc can additionally exert the same effects as those in the cases of the aforementioned probes Pr2 and Pr3.

The restriction hole 35 illustrated in FIG. 13 can be formed by drilling the restriction plate 335 made of a resin material or the like. Specifically, the restriction hole 35 can be formed by drilling the restriction plate 335 to form two through holes corresponding to the extended hole portions 352 and 353 and the hole main body portion 351 having a larger diameter than those of the two through holes to overlap with the two through holes. Also, the processing means is not limited to the mechanical drilling and may be laser processing, for example. Also, the restriction plate 335 may be made of a film member, for example, and the restriction hole 35 may be formed in the film member by means of laser processing, for example.

What is claimed is:

1. A probe having a bar-like shape, comprising:
   a distal end portion with a columnar shape adapted to be in contact with an inspection point provided on a device under test;
   a base end portion on an opposite side of the distal end portion; and
   a main body portion formed in a flat ribbon shape and extended to connect the distal end portion to the base end portion,
   wherein the distal end portion is provided with a distal end surface inclined relative to and intersecting with an axial center of the probe.

2. The probe according to claim 1, wherein, on both edge portions on lateral sides of the distal end surface, chamfered surfaces that communicate with a circumferential surface of the distal end portion and that are tapered are formed.

3. The probe according to claim 2, wherein a width direction of the distal end surface and a width direction of the main body portion formed in the ribbon shape are in an equal direction.

4. The probe according to claim 2, wherein a width direction of the distal end surface and a width direction of the main body portion formed in the ribbon shape are perpendicular to each other.

5. The probe according to claim 4, wherein the main body portion is curved to protrude in a direction perpendicular to a wide width surface formed in the ribbon shape.

6. The probe according to claim 1, wherein a width direction of the distal end surface and a width direction of the main body portion formed in the ribbon shape are in an equal direction.

7. The probe according to claim 1, wherein a width direction of the distal end surface and a width direction of the main body portion formed in the ribbon shape are perpendicular to each other.

8. The probe according to claim 1, wherein the main body portion is curved to protrude in a direction perpendicular to a wide width surface formed in the ribbon shape.

9. An inspection jig comprising:
   a plurality of probes each of which is the probe according to claim 1; and
   a holding member adapted to hold the plurality of probes in a direction perpendicular to the wide width surface formed in the ribbon shape with two adjacent probes in the plurality of probes as a pair and in a direction in which the probes as the pair are adjacent to each other such that apex portions of the distal end surfaces may be closest to each other in a state in which the probes as the pair are bent in equal directions.

10. The inspection jig according to claim 9, wherein, in the base end portion, a dimension in a width direction perpendicular to the axial center is larger than a dimension in a thickness direction perpendicular to the width direction,
    wherein the holding member includes a restriction plate provided with restriction holes into which the base end portions of the plurality of probes are respectively inserted, and
    wherein, in each of the restriction holes, a length in a first direction perpendicular to a depth direction is longer than the dimension in the width direction of the base end portion, and a length in a second direction perpendicular to the first direction is shorter than the dimension in the width direction of the base end portion.

11. The inspection jig according to claim 10, wherein a width direction of the distal end surface and the width direction of the base end portion are in an equal direction.

12. The inspection jig according to claim 10, wherein in each of the restriction holes, the length in the second direction is longer than a maximum width of the main body portion.

13. The inspection jig according to claim 10,
    wherein the restriction plate includes a rear surface from which a distal end of the base end portion protrudes, and
    wherein each of the restriction holes is arranged at a position away from the rear surface by a predetermined distance.

14. An inspection apparatus comprising:
    the inspection jig according to claim 10; and
    an inspection processing unit configured to inspect the device under test on a basis of an electric signal obtained by bringing the probe into contact with the inspection point.

15. An inspection apparatus comprising:
    the inspection jig according to claim 9; and
    an inspection processing unit configured to inspect the device under test on a basis of an electric signal obtained by bringing the probe into contact with the inspection point.

16. An inspection jig comprising:
a plurality of probes each having a bar-like shape and including a distal end portion with a columnar shape adapted to be in contact with an inspection point provided on a device under test, a base end portion on an opposite side of the distal end portion, and a main body portion extended to connect the distal end portion to the base end portion, the distal end portion being provided with a distal end surface inclined relative to and intersecting with an axial center with the bar-like shape, and in the base end portion, a dimension in a width direction perpendicular to the axial center being larger than a dimension in a thickness direction perpendicular to the width direction; and
a holding member adapted to hold the plurality of probes with two adjacent probes in the plurality of probes as a pair and in a direction in which the probes as the pair are adjacent to each other such that apex portions of the distal end surfaces may be closest to each other,
wherein the holding member includes a restriction plate provided with restriction holes into which the base end portions of the plurality of probes are respectively inserted, and
wherein, in each of the restriction holes, a length in a first direction perpendicular to a depth direction is longer than the dimension in the width direction of the base end portion, and a length in a second direction perpendicular to the first direction is shorter than the dimension in the width direction of the base end portion.

17. The inspection jig according to claim 16, wherein a width direction of the distal end surface and the width direction of the base end portion are in an equal direction.

18. The inspection jig according to claim 16, wherein in each of the restriction holes, the length in the second direction is longer than a maximum width of the main body portion.

19. The inspection jig according to claim 16,
wherein the restriction plate includes a rear surface from which a distal end of the base end portion protrudes, and
wherein each of the restriction holes is arranged at a position away from the rear surface by a predetermined distance.

20. An inspection apparatus comprising:
the inspection jig according to claim 16; and
an inspection processing unit configured to inspect the device under test on a basis of an electric signal obtained by bringing the probe into contact with the inspection point.

* * * * *